United States Patent [19]
Harajiri

[11] Patent Number: 5,348,906
[45] Date of Patent: Sep. 20, 1994

[54] METHOD FOR MANUFACTURING SEMICONDUCTOR DEVICE

[75] Inventor: Shuichi Harajiri, Kawasaki, Japan

[73] Assignee: Fujitsu Ltd., Kawasaki, Japan

[21] Appl. No.: 26,098

[22] Filed: Mar. 4, 1993

Related U.S. Application Data

[63] Continuation of Ser. No. 751,808, Aug. 20, 1991, abandoned.

[30] Foreign Application Priority Data

Aug. 31, 1990 [JP]  Japan ................................. 2-231517

[51] Int. Cl.$^5$ ............................................. H01L 21/70
[52] U.S. Cl. ........................................ 437/54; 437/67; 437/203
[58] Field of Search ............... 437/38, 40, 47, 48, 437/52, 54, 60, 67, 195, 235, 233, 919; 257/301

[56] References Cited

U.S. PATENT DOCUMENTS 4,921,816  5/1990  Ino ..................................... 437/203
5,017,506  5/1991  Shen et al. ............................ 437/52

FOREIGN PATENT DOCUMENTS 0176254  4/1986  European Pat. Off. .

Primary Examiner—Tom Thomas
Attorney, Agent, or Firm—Armstrong, Westerman, Hattori, McLeland & Naughton

[57] ABSTRACT

In a manufacturing method of a semiconductor device in the field of large-scale integrated circuits utilizing a trench isolation technique; said method includes the steps of: forming first and second films having stepped portions on first and second underlying films adjacent to one another; forming a conductive film so that the first and second films having stepped portions are also covered; forming a first resist mask for forming gate electrodes on the conductive film and simultaneously forming a second resist mask on at least part of the conductive film corresponding to the stepped portions of the first and second films, the first and second resist masks being simultaneously formed; dry-etching the conductive film through the first and second resist masks to form gate electrodes while leaving the conductive film on the stepped portions of the first and second films; and removing the first and second resist masks.

15 Claims, 7 Drawing Sheets

METHOD FOR MANUFACTURING SEMICONDUCTOR DEVICE

This application is a continuation of application Ser. No. 07/751,808 filed Aug. 20, 1991, now abandoned.

BACKGROUND OF THE INVENTION

1. Field of the Invention

The present invention relates to a method for manufacturing a semiconductor device in the field of so-called LSI's (large-scale integrated circuits) inclusive of very large-scale integrated circuits and extra super large-scale integrated circuits, in particular those in which the trench-isolation technique is utilized.

The method for manufacturing an integrated circuit according to the present invention is characterized in that gate electrodes are formed by etching a polysilicon film deposited on the whole surface of a substrate without leaving, on the stepped portions of the silicon oxide film on a field oxide film, any etching residue that causes dust and thereby preventing reduction of yield and deterioration of the quality of the resulting devices and substantially reducing the cost for manufacturing semiconductor devices.

2. Description of the Related Art

In the conventional analog-digital hybrid LSI, in particular MOS LSI, the analog part has been separated from the digital part through the isolation method using trenches to prevent mixing of noises in the analog part and further the analog part and digital part can be completely separated if the trench isolation method is adopted in combination with a semiconductor substrate on a dielectric such as silicon-on-insulator (SOI).

In this case, polysilicon having good covering properties (coverage) is currently used as a material to be embedded in the trench. However, the polysilicon is in general used after subjecting it to an oxidation treatment to thus prevent the formation of a short-circuit between the polysilicon film in the trench and a wiring layer, since it also serves as a semiconductor.

However, it is liable to cause crystalline defects within the semiconductor layer due to a stress applied thereto during the oxidation treatment. As measures to prevent the occurrence of such crystalline defects, there has been adopted, for instance, a method that comprises forming a silicon oxide film on a polysilicon film according to a vapor growth method such as vapor phase epitaxy (VPE) or a chemical vapor deposition (CVD) method instead of oxidizing the polysilicon film, or a method in which the polysilicon film is formed not only in the trench, but also over the upper portion thereof in the form of a pad and only the superficial portion of the polysilicon film is oxidized under conditions such that the polysilicon within the trench is not oxidized. Thus, the spread of the stress even to the semiconductor layer and hence the occurrence of the crystalline defects within the semiconductor layer during the oxidation treatment have been prevented.

There has also been adopted, as a measure to prevent the occurrence of crystalline defects, a method in which an oxidized polysilicon layer in the form of a pad is utilized as a contact between the oxidized layer and a wiring layer so that an electric voltage can be applied thereto, since the polysilicon film within the trench also serves as an electrode to thus deteriorate the quality of the elements.

In conventional methods for producing LSI's such as the foregoing method which comprises forming a polysilicon film in and over a trench in the form of a pad or a mushroom-shape cross section and then oxidizing only the superficial portion thereof or the method in which an oxidized polysilicon layer in the form of a pad is utilized as a contact between the oxidized layer and a wiring layer so that an electric voltage can be applied thereto, a gate electrode is formed by depositing a polysilicon film on the entire surface of a substrate and dry-etching the film, but part of the polysilicon film as a material for the gate remains, as an etching residue, on the stepped portion of a silicon oxide layer formed by oxidizing the polysilicon film on a field oxide film; the etching residue comprising the polysilicon is lifted off in the subsequent process and serves as dust and causes reduction of yield and deterioration of the quality of the resulting semiconductor device. In this respect, the dry etching is adopted because it is particularly effective for forming fine gate electrode patterns.

Such a problem of the formation of an etching residue serving as a dust likewise arises in cases wherein a silicon oxide film is formed on a polysilicon film through the CVD method.

This problem has conventionally been solved by etching the stepped portions carrying the etching residue comprising polysilicon with an isotropic etchant through a resist mask having openings corresponding to the stepped portions to thus remove the etching residue.

However, this conventional manufacturing method requires the use of one additional resist mask which leads to an increase in the cost of manufacturing semiconductor devices.

SUMMARY OF THE INVENTION

The object of the present invention is to provide a method for manufacturing a semiconductor device that makes it possible to form gate electrodes by dry-etching a polysilicon film deposited on the entire surface of a substrate without leaving any etching residue, which causes dust, on the stepped portion of a silicon oxide film over a field oxide film, to correspondingly prevent the reduction of yield and deterioration of the quality of the resulting semiconductor device due to the presence of the etching residue and to accordingly reduce the cost of manufacturing the semiconductor device.

According to an aspect of the present invention, there is provided a method of manufacturing a semiconductor device that comprises the steps of forming first and second films having stepped portions on first and second underlying films adjacent to one another; forming a conductive film so that the first and second films having the stepped portions are also covered; forming a first resist mask for forming gate electrodes on the conductive film and simultaneously forming a second resist mask on at least a part of the conductive film corresponding to the stepped portions of the first and second films, the first and second resist masks being simultaneously formed; dry-etching the conductive film through the first and second resist masks to form gate electrodes while leaving the conductive film on the stepped portions of the first and second films; and removing the first and second resist masks.

In the method of the present invention, upon dry-etching the polysilicon film to form gate electrodes, the resist mask is formed to cover the polysilicon film at the stepped portions of the silicon oxide film and, therefore, the polysilicon film on the stepped portions of the silicon oxide film is more strictly protected from attack by plasma during the dry etching process as compared with the conventional method in which dry-etching is performed only through the resist mask for forming the gate electrodes.

DESCRIPTION OF THE PREFERRED EMBODIMENTS

An embodiment of the conventional method for manufacturing a semiconductor device will be explained below with reference to FIGS. 3 to 5(B) and the method of the present invention will also be described in comparison with the conventional method with reference to FIGS. 1(A) and 2(C).

Figure 3:
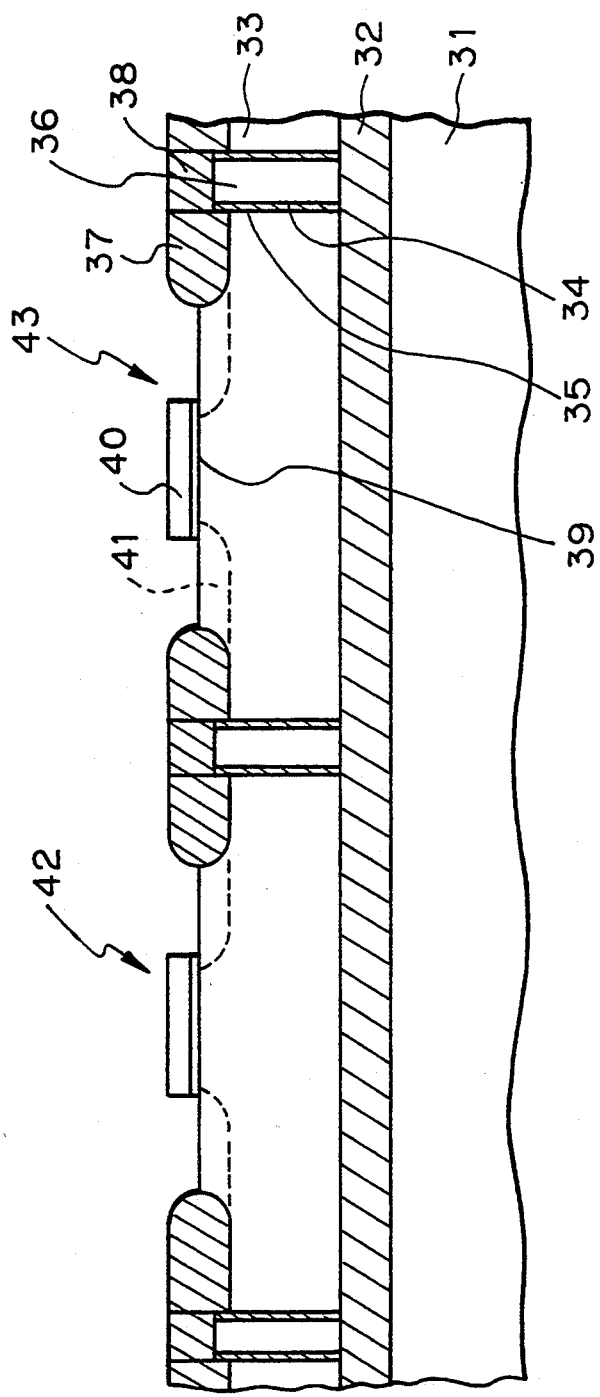
FIG. 3 is a cross sectional view showing the structure of a conventional semiconductor device in which the digital part is separated from the analog part through the use of an Si thin film and a trench structure.

FIG. 3 is a cross sectional view showing a semiconductor substrate such as SOI (silicon-on-insulator) and a trench structure and FIGS. 4(A), 4(B), 4(C), 4(D), 4(E) and 4(F) are diagrams for explaining the process of a conventional method of manufacturing a semiconductor device. In these figures, the reference numeral 31 is a substrate of, for instance, Si; 32 an insulating layer of, for instance, $SiO_2$; 33 an Si semiconductor layer; 34 a trench; 35 a silicon oxide film of, for instance, $SiO_2$; 36 a polysilicon film embedded within the trench 34; 37 a field film of, for instance, $SiO_2$; 38 a silicon oxide film of, for instance, $SiO_2$ formed through the oxidation of the polysilicon film 36; 39 an oxidized film for gate comprising, for instance, $SiO_2$; 40 a gate electrode of, for instance, poly-Si; 41 a source-drain diffusion layer; 42 an analog part; 43 a digital part; 44 a silicon oxide film of, for instance, $SiO_2$; 45 a silicon nitride film of, for instance, $Si_3N_4$; 46 a crystalline defect; 47 and 48 silicon oxide films of, for instance, $SiO_2$; 49 an interlayer insulating film of, for instance, PSG (phosphosilicate glass); 50 a contact hole formed through the interlayer insulating film 49 and the silicon oxide film 48; and 51 a wiring layer of, for instance, Al.

As shown in FIG. 3, in an analog-digital hybrid LSI (in particular, MOS LSI), the analog part 42 has conventionally been separated from the digital part 43 through the isolation method using a trench 34 to prevent mixing of noises in the analog part 42 and further the analog part and the digital part can be completely separated if the trench isolation method is adopted in combination with a semiconductor substrate on a dielectric such as SOI.

In this case, a polysilicon having good covering properties (coverage) is currently used as a material to be embedded in the trench 34. However, the polysilicon is in general used after subjecting it to an oxidation treatment to thus prevent the formation of a short-circuit between a polysilicon film 36 in the trench 34 and a wiring layer 51, since it also serves as a semiconductor.

Figure 4A:
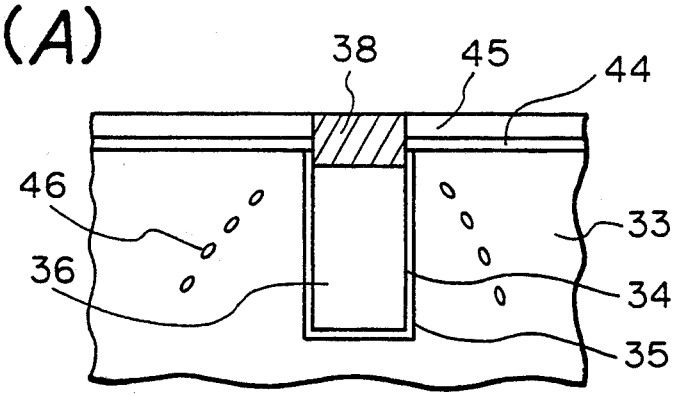
FIGS. 4(A), 4(B), 4(C), 4(D) and 4(E) each is a cross sectional view of a semiconductor device for illustrating a conventional method for the production thereof.
Figure 4B:
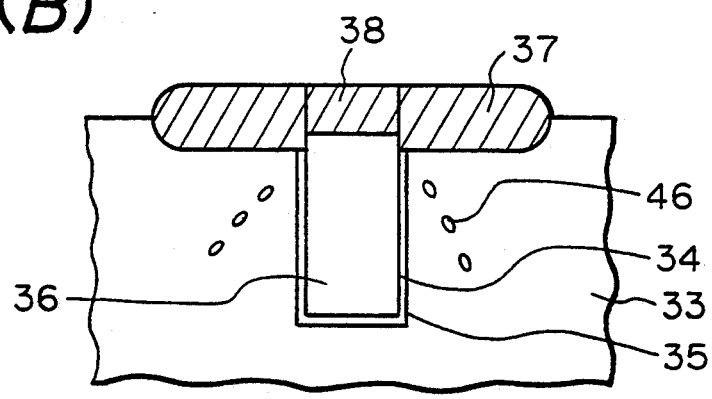
Figure 4C:
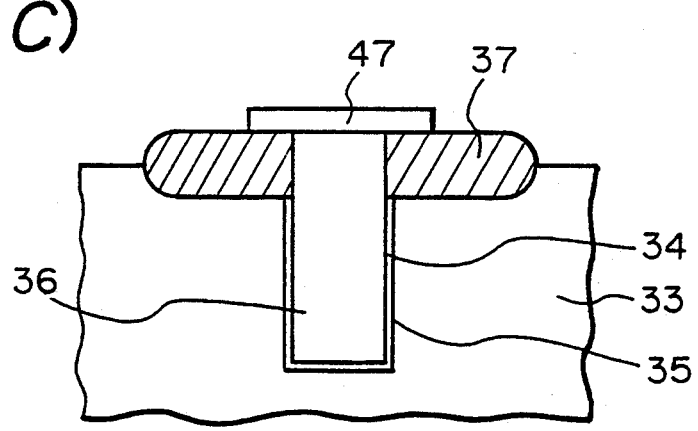
Figure 4D:
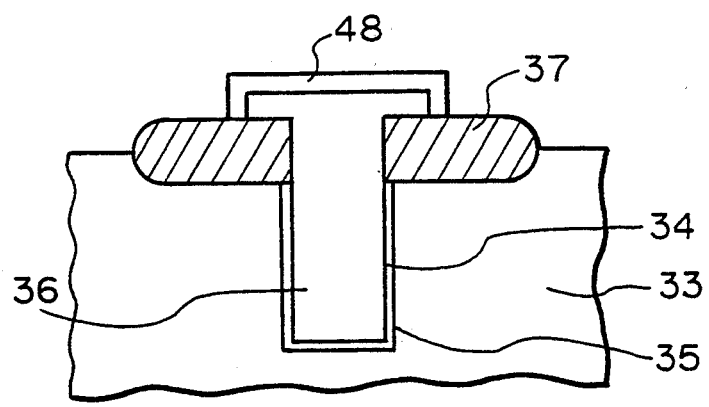

However, it is liable to cause crystalline defects 46 within a semiconductor layer 33 due to stress applied thereto during the oxidation treatment as shown in FIGS. 4(A) and 4(B). For this reason, there has been adopted, for instance, a method that comprises forming a silicon oxide film 47 on the polysilicon film 36 according to a vapor growth method, as shown in FIG. 4(C), instead of oxidizing the polysilicon film 36, or a method in which the polysilicon film 36 is formed not only in the trench 34, but also over the upper portion thereof in the form of a pad and only the superficial portion 38 of the polysilicon film is oxidized under conditions such that the polysilicon within the trench 34 is not oxidized, as shown in FIG. 4(D). Thus, the generation of any stress in the semiconductor layer 33 and hence the occurrence of crystalline defects 46 within the semiconductor layer 33 during the oxidation treatment can be prevented.

Figure 4E:
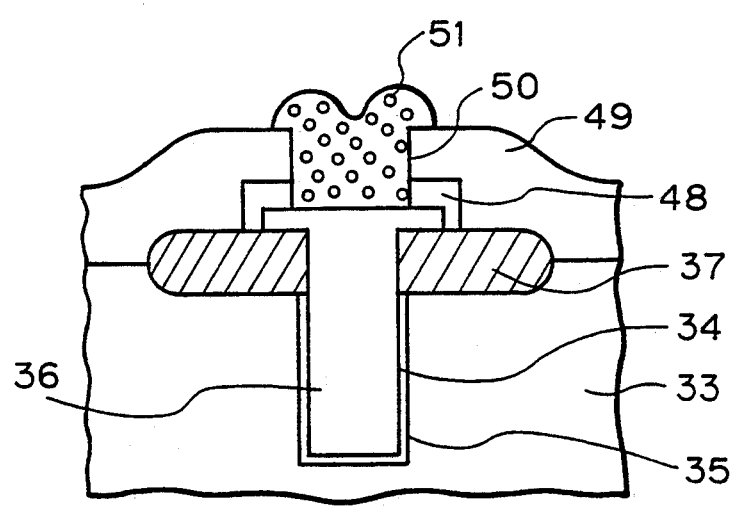
Figure 5A:
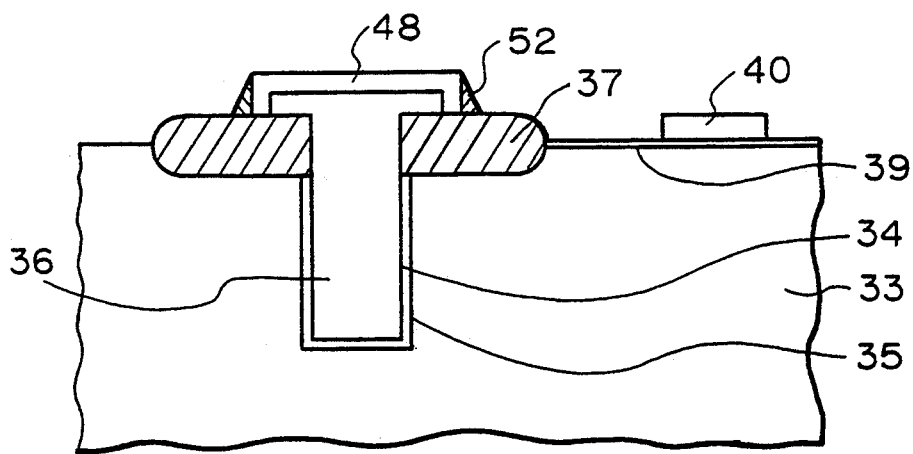
FIGS. 5(A) and 5(B) are diagrams illustrating a part of the polysilicon film remaining on a silicon stepped portion (48) as the etching residue (FIG. 5(A)), the removal of which has been an object of conventional methods, and the removal of the etching residue by a conventional method that comprises covering the portions other than the stepped portion with a resist mask and then etching the stepped portion with an isotropic etchant (FIG. 5(B)).
Figure 5B:
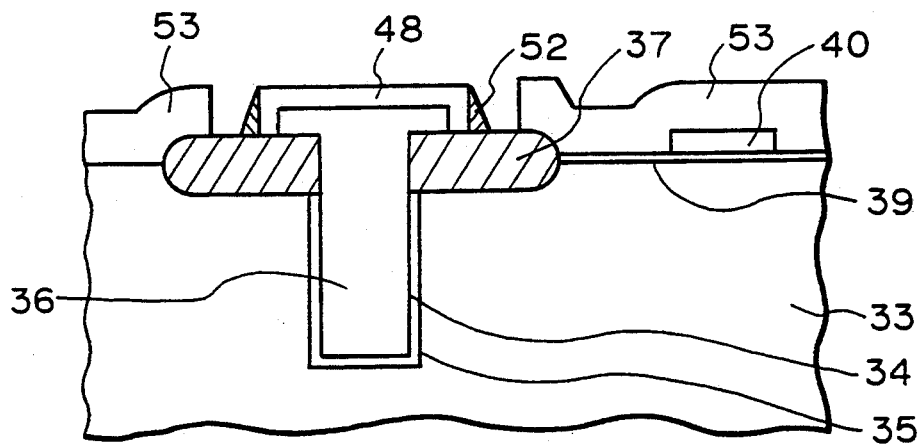

Alternatively, it is also possible to utilize an oxidized silicon layer 48 in the form of a pad as a contact between the oxidized layer 48 and the wiring layer 51 so that an electric voltage can be applied thereto as shown in FIG. 4(E), since the polysilicon film 36 within the trench 34 also serves as an electrode to thus deteriorate the quality of the resulting semiconductor device.

In conventional methods of manufacturing semiconductor devices, as shown in FIGS. 4(D) and 4(E), a gate electrode 40 is formed by depositing a polysilicon film on the entire surface of the semiconductor layer 33 and dry-etching the film, but a part of the polysilicon film as the material for the gate remains, as an etching residue 52, on the stepped portion of the silicon oxide layer 48 formed by oxidizing the polysilicon film 36 on a field oxide film 37, the etching residue 52 comprising polysilicon is lifted off in the subsequent process and serves as dust or refuse and causes reduction of yield and deterioration of the quality of the resulting semiconductor device. In this respect, the dry etching is adopted because it is particularly effective for forming fine patterns of the gate electrodes 40.

Such a problem of the formation of the etching residue serving as a dust likewise arises when the silicon oxide film 47 is formed on polysilicon film 36 through the CVD method, as shown in FIG. 4(C).

This problem has conventionally been solved by etching the stepped portion carrying the etching residue 52 comprising polysilicon with an isotropic etchant through a resist mask 53 having an opening corresponding to the stepped portion of the oxidized silicon layer 48 to thus remove the residue.

However, this conventional production method requires the use of one additional resist mask, i.e., the resist mask 53, which leads to an increase in the cost of manufacturing semiconductor devices.

Under such circumstances, the present invention is intended to provide a method of manufacturing a semiconductor device that makes it possible to form gate electrodes by dry-etching a polysilicon film deposited on the entire surface of a substrate without leaving any etching residue, which causes dust, on stepped portions of a silicon oxide film over a field oxide film, to correspondingly prevent the reduction of yield and deterioration of the quality of the resulting semiconductor device due to the presence of the etching residue, and accordingly reduce the cost of manufacturing the semiconductor devices.

The method of the present invention will hereinafter be explained in more detail with reference to FIGS. 1(A), 1(B), 1(C), 1(D), 1(E) and 1(F) and 2(A), 2(B) and 2(C).

FIGS. 1(A), 1(B), 1(C), 1(D), 1(E) and 1(F) are diagrams for explaining the processes of an example of the method according to the present invention. In FIGS. 1(A), 1(B), 1(C), 1(D), 1(E) and 1(F), the reference numeral 1 represents a semiconductor substrate of, for instance, Si; 2 a silicon oxide film of, for instance, $SiO_2$; 3 a silicon nitride film of, for instance, $Si_3N_4$; 4 an opening formed in the silicon nitride film 3; 5 a field oxide film of, for instance, $SiO_2$; 6 a silicon oxide film of, for instance, $SiO_2$ (or PSG); 7 an opening formed through the silicon oxide film 6 and the field oxide film 5; 8 a trench formed on the substrate 1; 9 a silicon oxide film of, for instance, $SiO_2$; 10a and 10b polysilicon films; 11 a silicon oxide film of, for instance, $SiO_2$; 12 a stepped portion formed between the field oxide film 5 and the silicon oxide film 11; 13 a gate oxide film of, for instance, $SiO_2$; 14 a polysilicon film; 14a a gate electrode of, for instance, poly-Si; and 15a and 15b resist masks.

This embodiment of the method for producing the semiconductor device will now be explained below.

Figure 1A:
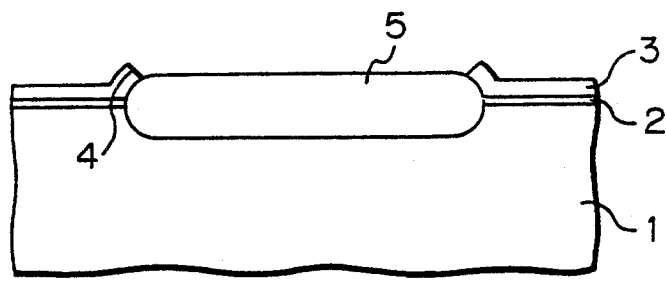
FIGS. 1(A), 1(B), 1(C), 1(D), 1(E) and 1(F) are diagrams for explaining the processes of an embodiment of the method according to the present invention.

First, as shown in FIG. 1(A), a substrate 1 is oxidized by, for instance, thermal oxidation to form a silicon oxide film 2 having a thickness of, for instance 500 Å and then depositing $Si_3N_4$ on the silicon oxide film 2 by, for instance, the CVD method to provide a silicon nitride film 3 having a thickness of, for instance, 1500 Å. Then the silicon nitride film 3 is selectively etched through, for instance, the reactive ion etching (RIE) technique to form an opening 4 for forming a field oxide film and then the substrate 1 is selectively oxidized through the opening 4 of the silicon nitride film 3 serving as a mask according to the LOCOS (local oxidation of silicon) method to form a field oxide film 5 having a thickness of, for instance, 8000 Å.

Figure 1B:
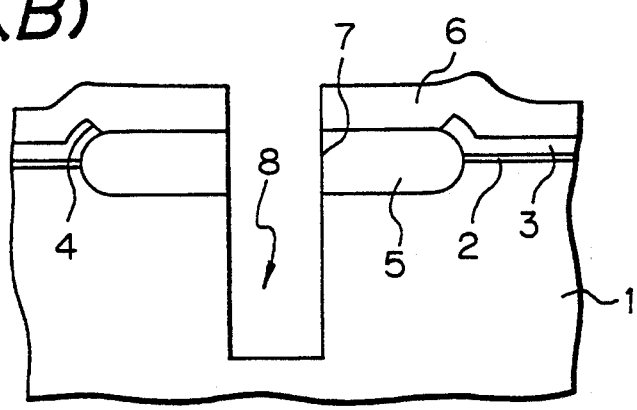

Then, as shown in FIG. 1(B), $SiO_2$ is deposited on the entire surface of the substrate 1 by, for instance, the CVD method to provide an insulating film 6 of, for instance, 8000 Å in thickness, thereafter the insulating film 6 and the field oxide film 5 are selectively etched through a resist mask (not shown) to form an opening 7 and to simultaneously expose the surface of the substrate 1 through the opening 7, then the resist mask is removed and the substrate 1 exposed through the opening 7 is etched through the insulating film 6 serving as a mask by, for instance, the reactive ion etching (RIE) technique to form a trench 8 having a size of, for instance 1.2 μm in width and 4 μm in depth.

Figure 1C:
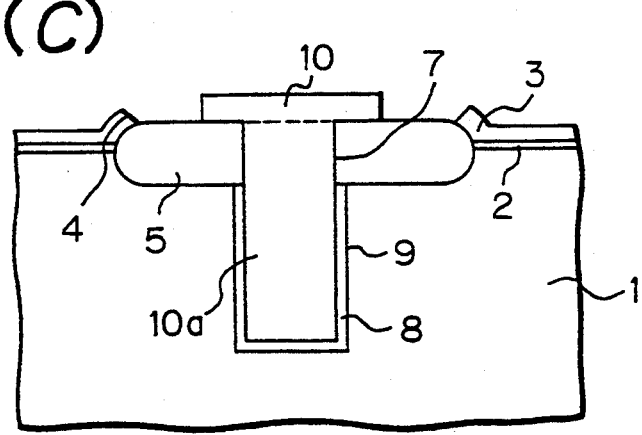

Thereafter, as shown in FIG. 1(C), the substrate exposed through the trench 8 is oxidized by, for instance, thermal oxidation to form a silicon oxide layer 9 of, for instance, 1000 Å in thickness and then the insulating film 6 is removed by, for instance, the RIE technique. Then poly-Si is deposited on the substrate, so that the groove consisting of the opening 7 and the trench 8 is covered, by a method such as the CVD method to form a polysilicon film 10a having a thickness of, for instance, 2.0 μm, the upper portion of the polysilicon film 10a is etched by, for instance, the RIE technique so as to remove it to the level of the field oxide film 5, Si is again deposited on the entire surface of the substrate by a method such as CVD to provide a polysilicon film 10b having a thickness of, for instance, 5000 Å and then the polysilicon film 10b is selectively etched by a method such as RIE so that a part thereof remains, in the form of a pad, over the polysilicon film 10a and the field oxide film 5.

Figure 1D:
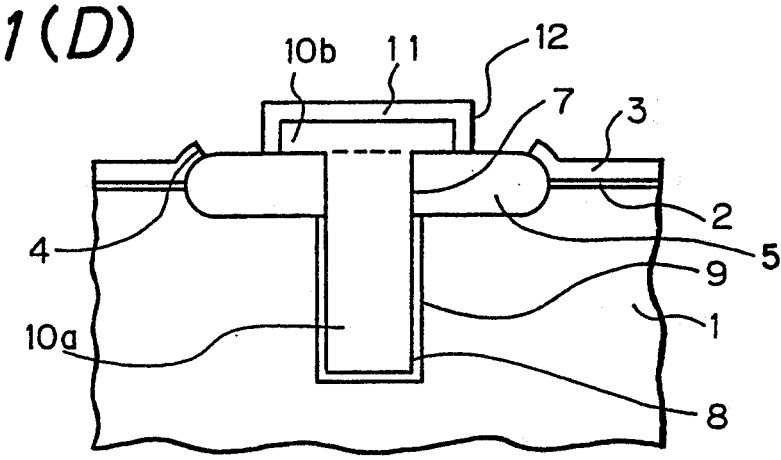

Then, as shown in FIG. 1(D), the superficial portion of the polysilicon film 10b is oxidized by, for instance, thermal oxidation to form a silicon oxide layer 11 having a thickness of, for instance, 2000 Å. At this stage, a stepped portion 12 is formed between the field oxide film 5 and the silicon oxide layer 11.

Figure 1E:
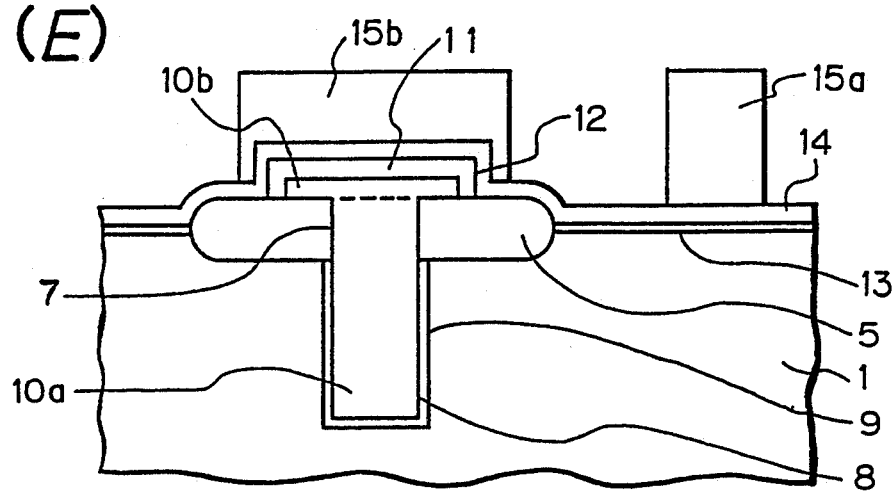

Then, as shown in FIG. 1(E), the silicon nitride film 3 and the silicon oxide film 2 are removed by, for instance, the wet-etching technique, the substrate 1 is oxidized by, for instance, thermal oxidation to form an oxidized layer 13 for gate having a thickness of, for instance, 300 Å and then poly-Si is deposited to the entire surface of the substrate by a method such as CVD to form a polysilicon film 14 of, for instance, 4000 Å in thickness. Then a resist material is coated on the entire surface of the substrate, exposed to light and developed to form a resist pattern or a resist mask 15a for forming a gate electrode on a part of the polysilicon film 14 corresponding to the gate oxide film 13 and simultaneously a resist mask 15b is formed so that it covers a part of the polysilicon film 14 corresponding to the stepped portion 12 of the silicon oxide layer 11. In this respect, the resist mask 15b also covers the portion of the polysilicon film 14 corresponding to the silicon oxide layer 11.

Figure 1F:
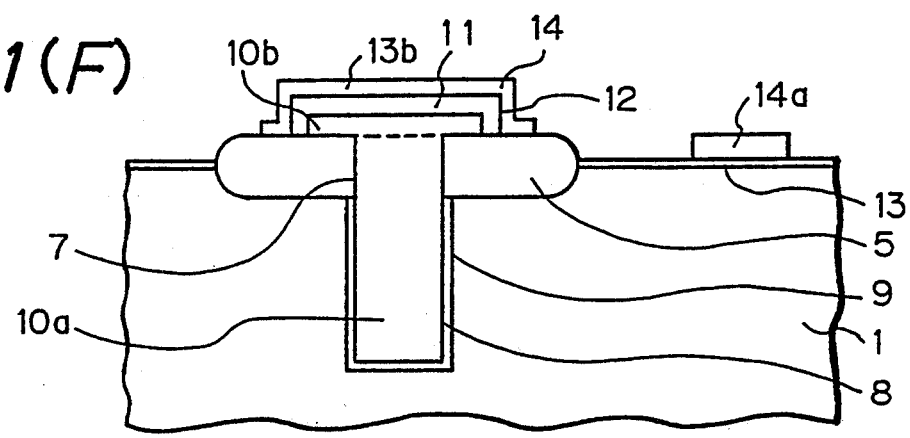

Thereafter, as shown in FIG. 1(F), the polysilicon film 14 is dry-etched by the RIE technique through the resist masks 15a and 15b to form a gate electrode 14a while leaving a part of the polysilicon film 14 on the stepped portion 12 of the silicon oxide layer 11.

Finally, a source/drain diffusion layer, an interlayer insulating film, a contact hole, a wiring layer or the like can be formed thereon to thus complete a semiconductor device.

In other words, the foregoing embodiment comprises the steps of simultaneously forming the resist mask 15a for forming the gate electrode on the polysilicon film 14 and the resist mask 15b so that it covers the part of the polysilicon film 14 corresponding to the stepped portion 12 of the silicon oxide layer 11, then dry-etching the polysilicon film 14 through the resist masks 15a and 15b to form the gate electrode 14a while leaving a part of the polysilicon film 14 so as to cover the stepped portion 12 of the silicon oxide layer 11. As has been described above, upon dry-etching the polysilicon film to form the gate electrode, the resist mask 15b protects the polysilicon film 14 to cover the same corresponding to the stepped portion of the silicon oxide layer and, therefore, the polysilicon film on the stepped portion of the silicon oxide layer is more strictly protected from attack by plasma during the dry etching process as compared with the conventional method in which dry-etching is performed only through the resist mask for forming the gate electrode.

Thus, it is possible to form the gate electrode by dry-etching without leaving any etching residue, which causes dust, on the stepped portion 12 of the silicon oxide layer 11 unlike the conventional methods, correspondingly the reduction of yield and deterioration of the quality of the resulting semiconductor device due to the presence of the etching residue can effectively be eliminated since the polysilicon film 14 remaining on the stepped portion 12 of the silicon oxide layer 11 is not lifted off to serve as dust in the subsequent process unlike the conventional techniques. Moreover, the process for removing the etching residue as in the conventional method can be omitted and accordingly the cost of producing the semiconductor device can be substantially reduced.

In the foregoing embodiment, the resist mask 15b is used for maintaining the polysilicon film 14 on the stepped portion 12 of the silicon oxide layer 11 as well as on the silicon oxide layer 11, but the present invention is by no means limited to this specific embodiment and the polysilicon film 14 may be left only on the stepped portion 12 of the silicon oxide layer 11. This embodiment will hereunder be described in detail with reference to the attached FIGS. 2(A), 2(B) and 2(C).

Figure 2A:
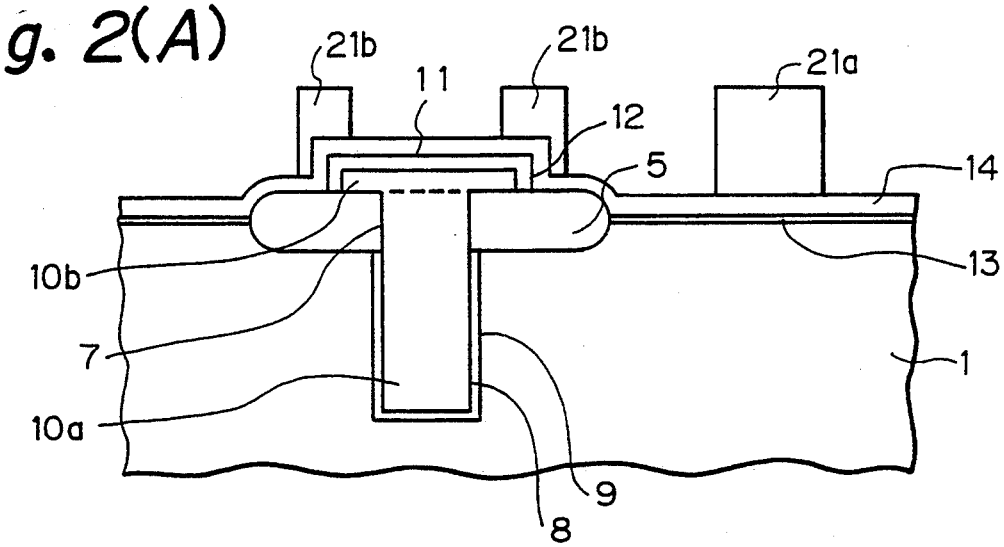
FIGS. 2(A), 2(B) and 2(C) are diagrams for illustrating another embodiment of the method according to the present invention.
Figure 2B:
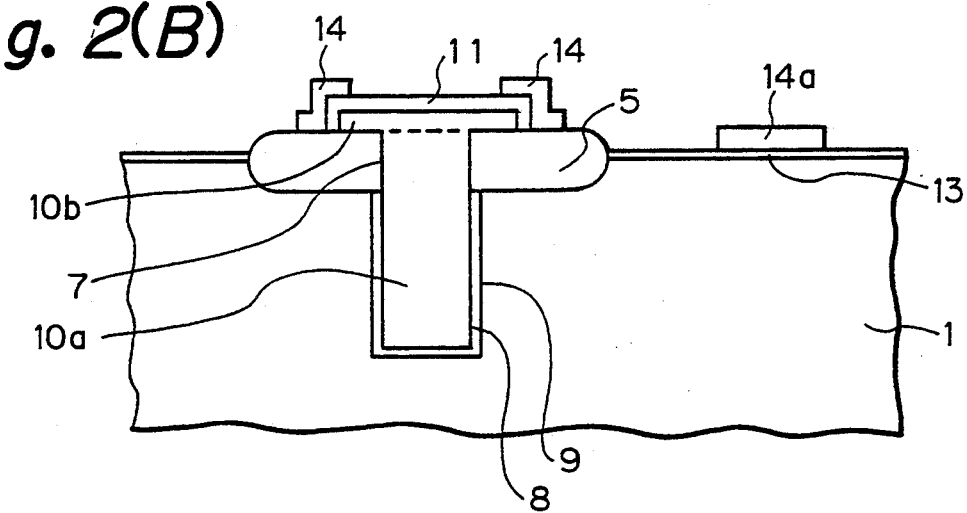
Figure 2C:
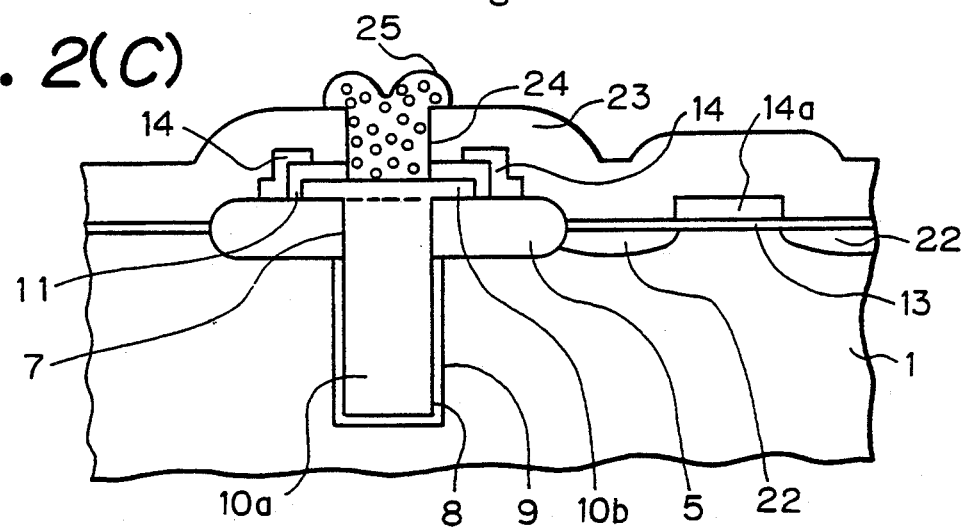

FIGS. 2(A), 2(B) and 2(C) are diagrams for illustrating another embodiment of the method according to the present invention. In FIGS. 2(A), 2(B) and 2(C), the same reference numerals as those used in FIGS. 1(A) to 1(F) represent parts identical to or corresponding to those used in FIGS. 1(A) to 1(F). The reference numerals 21a and 21b represent resist masks; 22 a source/drain diffusion layer; 23 an interlayer insulating layer of, for instance, PSG; 24 a contact hole formed through the interlayer insulating layer 23 and the silicon oxide layer 11; and 25 a wiring layer of, for instance, Al.

Then this embodiment of the method as shown in FIGS. 2(A) to 2(C) will be explained below.

In this method, the process from the formation of a silicon oxide layer 2 to the formation of a polysilicon film 14 are the same as those already explained above in connection with FIGS. 1(A) to 1(F) and, therefore, the explanation thereof is herein omitted.

As shown in FIG. 2(A), after the formation of the polysilicon film 14, a resist is applied onto the entire surface of a substrate and subjected to patterning that comprises exposing it to light and developing the same to form a resist mask 21a for forming a gate electrode on a part of the polysilicon film corresponding to a gate oxide film 13 and to simultaneously form a resist mask 21b on a part of the gate oxide film 13 corresponding to a stepped portion 12 of the silicon oxide layer 11.

Then, as shown in FIG. 2(B), the polysilicon film 14 is dry-etched through the resist masks 21a and 21b by the RIE technique to form a gate electrode 14a while leaving a part of the polysilicon film 14 corresponding to the stepped portion 12 of the silicon oxide layer 11.

Finally, a source/drain diffusion layer 22, an interlayer insulating film 23 of PSG, a contact hole 14, a wiring layer 25 of Al or the like are formed thereon to thus complete a semiconductor device.

In the foregoing embodiments, there have been cases explained in which the polysilicon film 14 is dry-etched to give the gate electrode 14a, but the present invention is by no means limited to these specific embodiments and may likewise be adopted for forming a wiring layer by dry-etching the polysilicon film 14.

According to the method of the present invention, as shown in FIGS. 1(A) to 1(F), when the polysilicon film 14 is dry-etched to form the gate electrode 14a, the resist mask 15b protects the polysilicon film 14 to cover a part of the film 14 corresponding to the stepped portion 12 of the silicon oxide layer 11 and, therefore, the part of the polysilicon film 14 on the stepped portion 12 of the silicon oxide layer 11 is more strictly protected from attack by plasma during the dry etching process compared with the conventional method in which dry-etching is performed only through the resist mask for forming the gate electrode.

Thus, it is possible to form the gate electrode by dry-etching the polysilicon film deposited on the entire surface of the substrate without leaving any etching residue, which becomes a cause of dust, on the stepped portion of the silicon oxide layer on the field oxide film; correspondingly, the reduction of yield and deterioration of the quality of the resulting semiconductor device due to the presence of the etching residue can effectively be eliminated. Moreover, the cost of manufacturing the semiconductor device can be substantially reduced.

We claim:

1. A method of manufacturing a semiconductor device comprising the steps of:
    forming a first film having first stepped portions formed on a semiconductor substrate;
    forming an insulating film having second stepped portions covering the surface of the first film to extend over the first stepped portions;
    forming a conductive film completely covering the first stepped portions of the first film and the second stepped portions of the insulating film by extending from an upper part to a lower part of the second stepped portions;
    forming a first resist mask for forming gate electrodes on the conductive film and simultaneously forming a second resist mask wholly covering the conductive film corresponding to the second stepped portions of the insulating film, the first and second resist masks being simultaneously formed;
    dry-etching the conductive film through the first and second resist masks; and
    removing the first and second resist masks, leaving a portion of the conductive film to cover the first stepped portions of the first film and the second stepped portions of the insulating film.

2. The method of claim 1 wherein upon forming a gate of wiring electrode pattern on a substrate of a semiconductor element having a steep stepped portion, the patterning is performed by forming a pattern of material for the gate or wiring electrode on the lower portion of the stepped portion or the lower and upper flat portions thereof so that the edge of the stepped portion is simultaneously included in the pattern.

3. The method of claim 2 wherein on a grooved substrate for a semiconductor element, the first stepped portion is formed by part of an insulating film projecting from the upper portion of the groove and spreading over the surface of the substrate.

4. The method of claim 2 wherein a polysilicon film is formed within the groove on the grooved substrate for a semiconductor element and the first stepped portion is formed by part of an polysilicon film projecting from the upper portion of the groove and spreading over the surface of the substrate.

5. The method of claim 2 wherein an amorphous silicon film is formed within the groove on the grooved substrate for a semiconductor element and the first stepped portion is formed from part of the amorphous silicon film projecting from the upper portion of the groove and spreading over the surface of the substrate.

6. The method of claim 4 wherein on the grooved substrate of a semiconductor element, the first film is formed of polysilicon and the second stepped portion of said insulating film is formed from an oxidized silicon layers projected from the upper portion of the groove.

7. The method of claim 5 wherein on the grooved substrate of a semiconductor element, the first film is formed of polysilicon and the second stepped portions of said insulating film is formed from an oxidized silicon layer projected from the upper portion of the groove.

8. A method of manufacturing a semiconductor device, comprising the steps of:
forming first and a second films having stepped portions on first and second underlying films adjacent to one another;
forming a conductive film so that the first and second film having stepped portions are also covered;
forming a first resist mask for forming mate electrodes on the conductive film and simultaneously forming a second resist mask on at least part of the conductive film corresponding to the stepped portions of the first and second films, the first and second resist masks being simultaneously formed;
dry-etching the conductive film through the first and second resist masks to form gate electrodes while leaving the conductive film on the stepped portions of the first and second films; and
removing the first and second resist masks,
wherein upon forming a gate or wiring electrode pattern on a substrate of a semiconductor element having a steep stepped portion, the patterning is performed by forming a pattern of a material for the gate or wiring electrode on the lower portion of the stepped portion or the lower and upper flat portions thereof so that the edge of the stepped portion is simultaneously included in the pattern,
wherein a polysilicon film is formed within the groove on the grooved substrate for a semiconductor element and the stepped portion is formed from apart of the polysilicon film projecting from the upper portion of the groove and spreading over the surface of the substrate, and
wherein a contact hole is formed through an interlayer insulating film arranged between the polycrystalline or amorphous silicon film in the groove and a wiring electrode other than the gate or wiring electrode to form an ohmic contact between the polycrystalline or amorphous silicon film and the wiring electrode.

9. The method of claim 8 wherein the patterning of the gate or wiring electrode is performed in a region including at least the lower portion of the contact hole on the upper portion of the polycrystalline or amorphous silicon film projecting from the upper portion of the groove and spreading over the surface of the substrate in a size similar to that of the contact hole.

10. The method of claim 8 wherein the patterning of the gate or wiring electrode is smaller than that of the contact hole.

11. The method of claim 8 wherein the patterning of the gate or wiring electrode is greater than that of the contact hole.

12. A method of manufacturing a semiconductor device comprising the steps of:
forming first and second films having stepped portions on first and second underlying films adjacent to another;
forming a conductive film so that the first and second films having stepped portions are also covered;
forming a first resist mask for forming gate electrodes on the conductive film and simultaneously forming a second resist mask on at least part of the conductive film corresponding to the stepped portions of the first and second films, the first and second resist masks being simultaneously formed;
dry-etching the conductive film through the first and second resist masks to form gate electrodes while leaving the conductive film on the stepped portions of the first and second films; and
removing the first and second resist masks,
wherein upon forming a gate or wiring electrode pattern on a substrate of a semiconductor element having a steep stepped portion, the patterning is performed by forming a pattern of a material for the gate or wiring electrode on the lower portion of the stepped portion or the lower and upper flat portions thereof so that the edge of the stepped portion is simultaneously included in the pattern,
wherein an amorphous silicon film is formed within the groove on the grooved substrate for a semiconductor element and the stepped portion is formed from part of the amorphous silicon film projecting from the upper portion of the groove and spreading over the surface of the substrate, and
wherein a contact hole is formed through an interlayer insulating film arranged between the polycrystalline or amorphous silicon film in the groove and a wiring electrode other than the gate or wiring electrode to form an ohmic contact between the polycrystalline or amorphous silicon film and the wiring electrode.

13. The method of claim 12, wherein the patterning of the gate or wiring electrode is performed in a region including at least the lower portion of the contact hole on the upper portion of the polycrystalline or amorphous silicon film projecting from the upper portion of the groove and spreading over the surface of the substrate in a size smaller to that of the contact hole.

14. The method of claim 12, wherein the patterning of the gate or wiring electrode is smaller than that of the contact hole.

15. The method of claim 12, wherein the patterning of the gate or wiring electrode is greater than that of the contact hole.

* * * * *